(12) United States Patent
Kim et al.

(10) Patent No.: US 6,627,379 B2
(45) Date of Patent: Sep. 30, 2003

(54) PHOTORESIST COMPOSITION FOR RESIST FLOW PROCESS, AND PROCESS FOR FORMING CONTACT HOLE USING THE SAME

(75) Inventors: Jin Soo Kim, Daejeon-shi (KR); Jae Chang Jung, Kyoungki-do (KR); Geun Su Lee, Kyoungki-do (KR); Ki Ho Baik, Kyoungki-do (KR)

(73) Assignee: Hynix Semiconductor Inc., Kyoungki (KR)

( * ) Notice: Subject to any disclaimer, the term of this patent is extended or adjusted under 35 U.S.C. 154(b) by 188 days.

(21) Appl. No.: 09/837,394

(22) Filed: Apr. 18, 2001

(65) Prior Publication Data

US 2002/0028405 A1 Mar. 7, 2002

(30) Foreign Application Priority Data

Apr. 19, 2000 (KR) ......................................... 2000-20809

(51) Int. Cl.⁷ ............................................... G03F 7/004
(52) U.S. Cl. .................... 430/270.1; 430/326; 430/905; 430/910
(58) Field of Search ............................. 430/270.1, 905, 430/910, 326

(56) References Cited

U.S. PATENT DOCUMENTS 5,962,180 A * 10/1999 Iwanaga et al. ............. 430/170
5,976,759 A * 11/1999 Urano et al. ............. 430/270.1
6,280,900 B1 * 8/2001 Chiba et al. ............. 430/270.1

FOREIGN PATENT DOCUMENTS

JP 2000-137329 5/2000

OTHER PUBLICATIONS

Adams, US 2001/0053496 A1, Dec. 20, 2001, patent application publication of Ser. No. 09/825,070.*
U.K. Search Report dated Jul. 27, 2001.

* cited by examiner

Primary Examiner—Rosemary Ashton
(74) Attorney, Agent, or Firm—Marshall, Gerstein & Borun

(57) ABSTRACT

Photoresist compositions which are useful in a resist flow process are disclosed. A process for forming a contact hole pattern using the disclosed photoresist compositions is also disclosed. The disclosed photoresist resin includes a mixture of two or more polymers. Preferably, a mixture of a first copolymer and a second copolymer are cross-linked, and thus it prevents a contact hole from being collapsed due to over flow which is typically observed during a conventional resist flow process. In addition, the disclosed photoresist compositions allow formation of uniform sized patterns.

27 Claims, 6 Drawing Sheets

PHOTORESIST COMPOSITION FOR RESIST FLOW PROCESS, AND PROCESS FOR FORMING CONTACT HOLE USING THE SAME

BACKGROUND

1. Field of the Disclosure

The present invention relates to photoresist compositions and process using the photoresist compositions. In particular, the present invention relates to photoresist compositions comprising a plurality of polymers, and methods for using the same.

2. Description of the Related Art

Resist flow processes are used in variety of industrial applications including the production of semiconductor devices. Resist flow processes are often used in the production of semiconductor devices to form a fine contact hole pattern. The resist flow process can be used to produce a contact hole pattern which exceeds the resolution of the exposing device. Typically, a resist flow process is used after a pattern is formed on a substrate using a photolithography process. The photolithography process generally involves both an exposure process and a development process. The photolithography process forms a photoresist contact hole pattern having a maximum resolution equal to that of the exposing device. In the resist flow process, this initially formed pattern is then heated to a temperature higher than the glass transition temperature of the photoresist resin which causes the photoresist resin to flow. This flow of photoresist resin reduces the size of contact hole until a fine contact hole necessary for the integration process is obtained (see FIG. 1).

Thus, the resist flow process makes it possible to obtain contact holes smaller than the resolution of an exposing device. Unfortunately, the resist flow process can result in a sudden or excessive photoresist resin flow (i.e., "overflow") which may result in a bent or collapsed contact hole pattern profile. This problem occurs typically at a temperature higher than the glass transition temperature of the photoresist resin.

The overflow can occur due to several factors including photoresist's sensitivity to heat, imprecise temperature control, and imprecise control of the flow time. In result of the overflow, contact hole pattern is collapsed.

Attempts to solve the overflow problem by improving control of the baking process, such as maintaining a uniform baking temperature and/or controlling the precise baking time, have been mostly unsuccessful.

SUMMARY OF THE DISCLOSURE

A solution to the above problems is provided by a photoresist composition that comprises a photoresist resin, a photoacid generator and an organic solvent. The photoresist resin comprises a first copolymer comprising a compound of Formula 1:

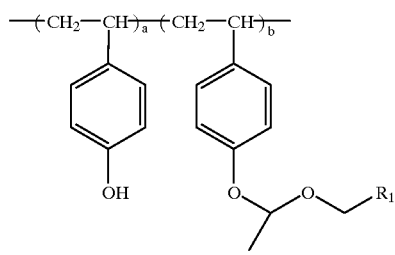

wherein
$R_1$ is H, a $(C_1-C_{10})$ alkyl or a $(C_1-C_{10})$ aryl, and
a second copolymer comprising a compound of the Formula 2:

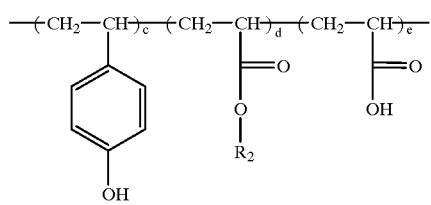

wherein $R_2$ is an acid labile protecting group.

In a refinement of the photoresist composition, a mol % ratio of a:b ranges from about 20:80 to about 80:20.

In a further refinement of the above photoresist composition, a mol % ratio of c:d:e is such that c ranges from about 30 mol % to about 70 mol %, d ranges from about 28 mol % to about 50 mol % and e ranges from about 2 mol % to about 15 mol %.

In a further refinement, a photoresist composition is used in a photoresist flow process.

In a further refinement, the acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-tert-butoxyethyl, 1-isobutoxyethyl and 2-acetylmenth-1-yl.

In another refinement, $R_1$ is a methyl group and $R_2$ is a butyl.

In a further refinement, a weight % ratio of the first copolymer to the second copolymer ranges from about 20:80 to about 80:20.

In another refinement, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

In another refinement, the photoacid generator is present in an amount ranging from about 0.05% to about 0.3% by weight of the photoresist resin.

In another refinement, the organic solvent is selected from the group consisting of propylene glycol methyl ether acetate, ethyl lactate, methyl 3-methoxypropionate, ethyl 3-ethoxypropionate and cyclohexanone and mixtures thereof.

In a further refinement, the organic solvent is present in an amount ranging from about 400% to about 800% by weight of the photoresist resin.

Another solution to the aforenoted problems is provided by a process for forming a photoresist pattern that comprises the steps of coating the photoresist composition of claim 1 on a substrate of a semiconductor element to form a photoresist film, forming a first photoresist pattern using a lithography process and producing a second photoresist pattern from said first photoresist pattern using a resist flow process.

In a refinement of the above process, the resist flow process comprises heating the first photoresist pattern to a temperature ranging from about 140° C. to about 170° C.

In another refinement, the first and second photoresist patterns comprise a contact hole pattern. A semiconductor element manufactured in accordance with the above process is also disclosed.

BRIEF DESCRIPTION OF THE DRAWINGS

The invention is described more or less diagrammatically in the accompanying drawings wherein.

DETAILED DESCRIPTION OF THE DISCLOSURE

Figure 1:
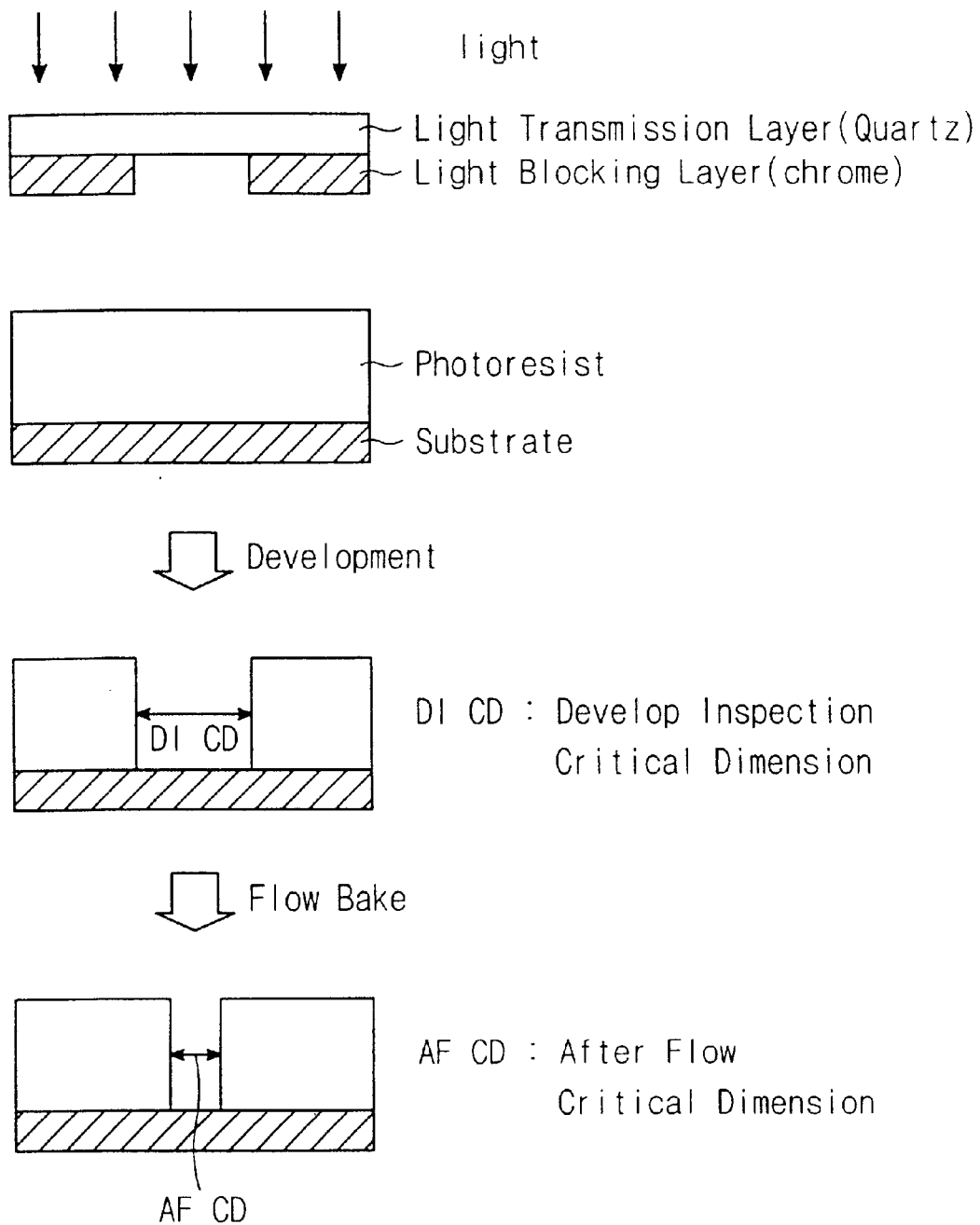
FIG. 1 is a schematic illustration of a prior art resist flow process.

A photoresist composition comprising more than two kinds of polymers, and methods for using the same is disclosed. In particular, a photoresist composition which is capable of reducing or eliminating overflow of photoresist resin during a resist flow process, thereby preventing a contact hole pattern from being bent or destroyed is disclosed.

During a resist flow process using a conventional photoresist composition, due to excessive photoresist resin flow, a contact hole pattern may be collapsed. However, this problem is overcome by using photoresist composition comprising more than two polymers by allowing them to go through a crosslinking reaction.

The photoresist composition of the present invention comprises photoresist resin comprising a mixture of at least two polymers with cross-linking ability, photoacid generator and organic solvent.

Preferably, the photoresist resin of the invention comprises two polymers: a polymer having phenol group of following Formula 1 and a polymer having carboxylic acid group of following Formula 2, respectively:

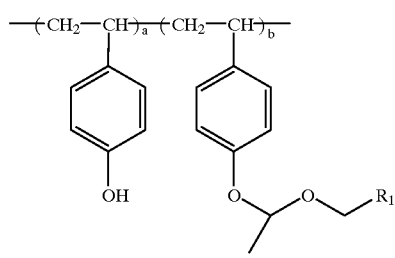

wherein
$R_1$ is H, a ($C_1$–$C_{10}$) alkyl or aryl; and
the ratio of a:b in mol % ranges from about 20:80 to about 80:20.

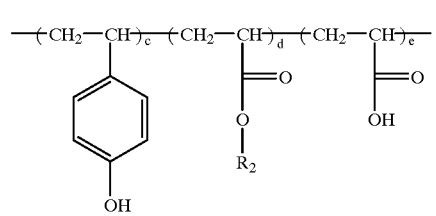

wherein
$R_2$ is an acid labile protecting group, which is selected from the group consisting of tert-butyl, tetrahydropyran-2-yl, 2-methyltetrahydropyran-2-yl, tetrahydrofuran-2-yl, 2-methyltetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-tert-butoxyethyl, 1-isobutoxyethyl and 2-acetylmenth-1-yl;

and the ratio of c:d:e is such that c ranges from about 30 mol % to about 70 mol %, d ranges from about 28 mol % to about 50 mol %, and e ranges from about 2 mol % to about 15 mol %.

Preferred first copolymers include, but are not limited to, the following polymer of formula 1a:

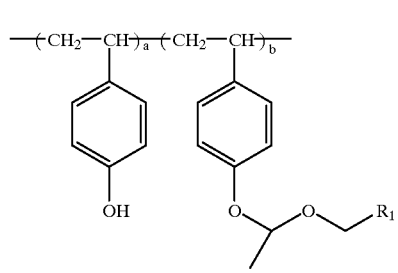

wherein $R_1$ is $CH_3$, and the ratio of a:b ranges from about 20:80 to about 80:20 in mol %.

Preferred second copolymers include, but are not limited to, the following polymer of formula 2a:

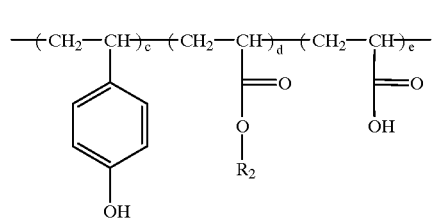

wherein $R_2$ is t-butyl; and the ratio of c:d:e is such that c ranges from about 30 mol % to about 70 mol %, d ranges from about 28 mol to about 50 mol %, and e ranges from about 2 mol % to about 15 mol %.

In one embodiment, the ratio of c:d:e is 50 mol %: 43 mol %: 7 mol %.

In addition, the weight % ratio between the first copolymer and the second copolymer can range from about 20:80 to about 80:20 and is preferably about 50:50.

The photoacid generator and organic solvent for the conventional photoresist composition can be used in photoresist compositions of the present invention.

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof. The photoacid generator is used in an amount ranging from about 0.05 wt % to about 0.3 wt % of the photoresist resin employed.

While a variety of organic solvents are suitable for use in the photoresist composition of the present invention, the organic solvent selected from the group consisting of propylene glycol methyl ether acetate, ethyl lactate, methyl 3-methoxypropionate, ethyl 3-ethoxypropionate and cyclohexanone and mixtures thereof is preferred. The amount of solvent used is preferably in the range of from about 400% to about 800% in comparison to the photoresist resin.

Another aspect of the present invention provides a process for producing a photoresist pattern comprising the steps of:
(a) coating the above described photoresist composition on a substrate of semiconductor element to form a photoresist film;
(b) forming a first photoresist pattern using a lithography process (preferably the first photoresist pattern has a lower resolution than the maximum resolution of an exposing device); and
(c) producing a second photoresist pattern from the first photoresist pattern using a resist flow (i.e., flow bake) process.

During a resist flow process using the photoresist compositions comprising mixed polymers of Formulas 1 and 2, if heat is applied to the flow bake process of the above step (c), hydroxyl group of the compound of the Formula 1 and carboxylic acid group of the compound of the Formula 2 cause esterification, resulting in cross-linking. Thus, the photoresist compositions are no longer flow and thereby prevent contact hole collapse. On the other hand, this cross-linking can happen not only between the above exemplified compounds but also the compound of Formula 2 itself.

The temperature of the flow bake process of step (c) is typically in the range of from about 140° C. to about 170° C., which is higher than glass transition temperature of the photoresist polymer.

Figure 6:
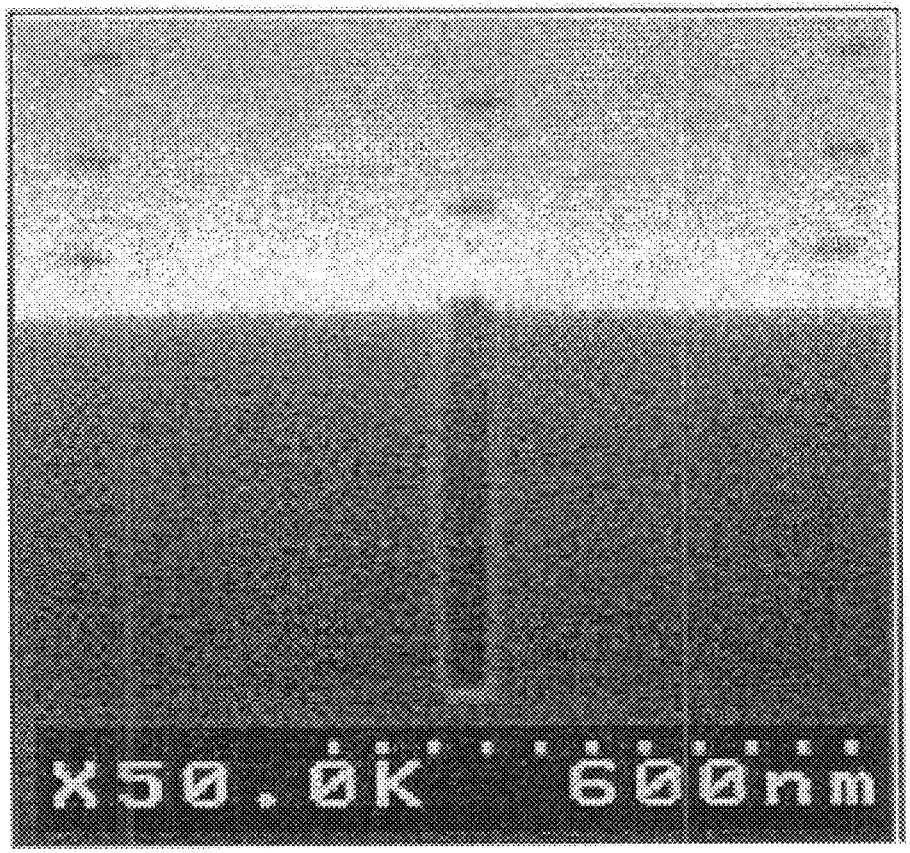
FIG. 6 shows etched oxide layer to form a contact hole which is a lower portion using a 50 nm pattern of FIG. 4c.

Still another refinement of the present invention provides a method for preparing a contact hole using the photoresist composition described above. In particular, a substrate coated with the photoresist composition of the present invention is etched using the second photoresist pattern (as described above) as an etching mask to form the contact hole. As illustrated in FIG. 6, a contact hole is formed by etching low oxide layer using the photoresist pattern as an etching mask which is formed in a resist flow process of the present invention.

Another refinement of the present invention provides a semiconductor element that is manufactured using the photoresist composition described above.

Yet another refinement of the present invention provides a photoresist resin comprising a mixed polymer of two compounds described above.

The present invention will now be described in more detail by referring to the examples below, which are not intended to be limiting, but mere examples of various refinements of the inventive concepts.

PREPARATION EXAMPLE 1

Synthesis of Polymer A

Using 3000L of round flask, to 1000 mL of anhydrous dimethylformamide (DMF) was added 120 g of poly(vinyl phenol) with molecular weight of 8000, 36 g of vinyl ether, and 0.2 g of p-toluenesulfonic acid. The mixture was refluxed for 24 hours. The resulting polymer was precipitated in water, filtered and dried to yield the title polymer of Formula 1, "Polymer A" (yield: 80%).

PREPARATION EXAMPLE 2

Synthesis of Polymer B

Using 3000L round flask, to 1000 mL of anhydrous dimethylformamide (DMF) was added 60 g of 4-hydroxystyrene, 55 g of t-butyl acrylate, 5 g of acrylic acid and 3.6 g of AIBN. The mixture was stirred at 67° C. under an nitrogen atmosphere for 4 hours. About 900 g of DMF was removed using a vacuum pump, and the resulting polymer was precipitated in cold water, and vacuum dried to yield the title polymer of Formula 2, "Polymer B" (molecular wt: 8600, yield: 70%).

EXPERIMENTAL EXAMPLE 1

Measurement of Thermal Physical Property of Photoresist

Figure 2:
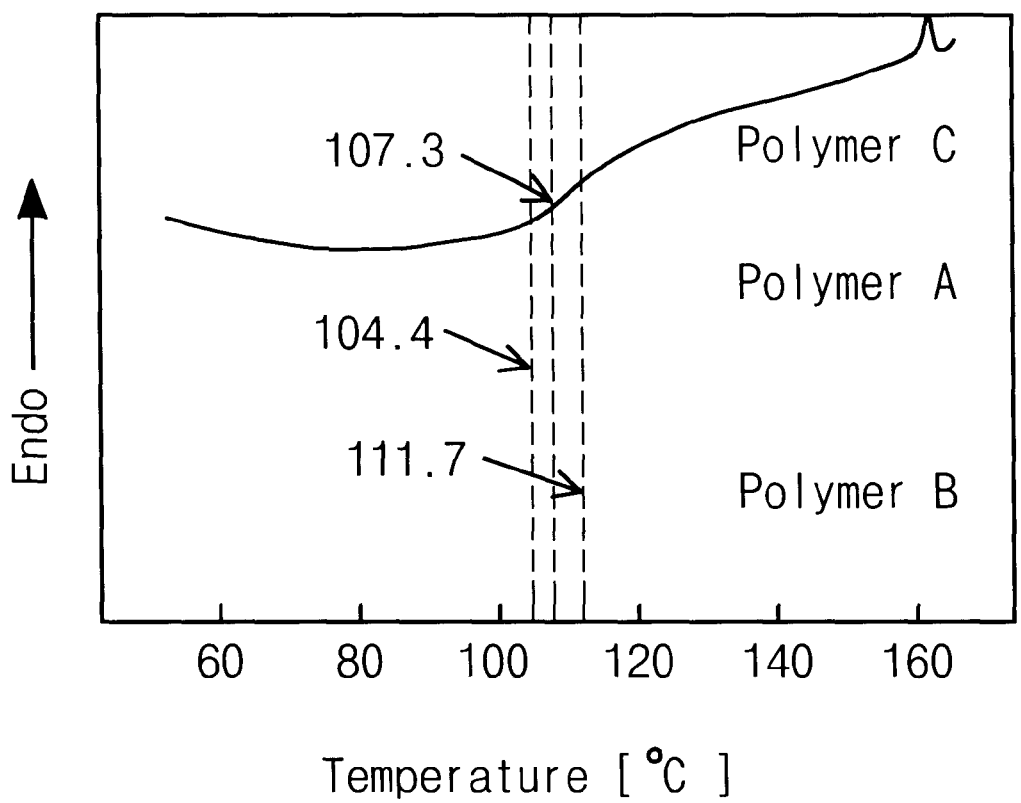
FIG. 2 graphically illustrates the thermal properties of photoresist polymers A, B and C described below.

FIG. 2 illustrates thermal physical properties of Polymers A, B and C. Here, polymer C is blending polymer of polymers A and B, which is prepared by dissolving two polymers at the ratio of 50 wt %: 50 wt % in propylene glycol methyl ether acetate (PGMEA), casting it on the petri dish and drying. Thus, glass transition temperature for polymer C is in the middle point of that of two Polymers A and B.

COMPARATIVE EXAMPLE 1

Synthesis of Resist-A

Polymer A (Formula 1a) was obtained using the procedure of Example 1 (10 g) wherein triphenylsulfonium triflate (0.25 g) and tetramethyl ammonium hydroxide (0.03 g) were added to 60 g of PGMEA. The mixture was refluxed for a day and filtered through a 0.20 µm filter to prepare the photoresist composition, "Resist-A."

COMPARATIVE EXAMPLE 2

Synthesis of Resist-B

Polymer B was obtained using the procedure of Example 2 (10 g) wherein triphenylsulfonium triflate (0.25 g) and tetramethyl ammonium hydroxide (0.03 g) were added to 60 g of PGMEA. The mixture was refluxed for a day and filtered through a 0.20 µm filter to prepare the photoresist composition, "Resist-B."

INVENTION EXAMPLE 1

Synthesis of Resist-C

The polymer A (5 g), the polymer B (5 g), triphenylsulfonium triflate (0.25 g), and tetramethyl ammonium hydroxide (0.03 g) were added to 60 g of PGMEA. The mixture was refluxed for a day and filtered through a 0.20 µm filter to prepare the photoresist composition, "Resist-C."

COMPARATIVE EXAMPLE 3

Experiment of Flow Properties of Resist-A

Figure 3:
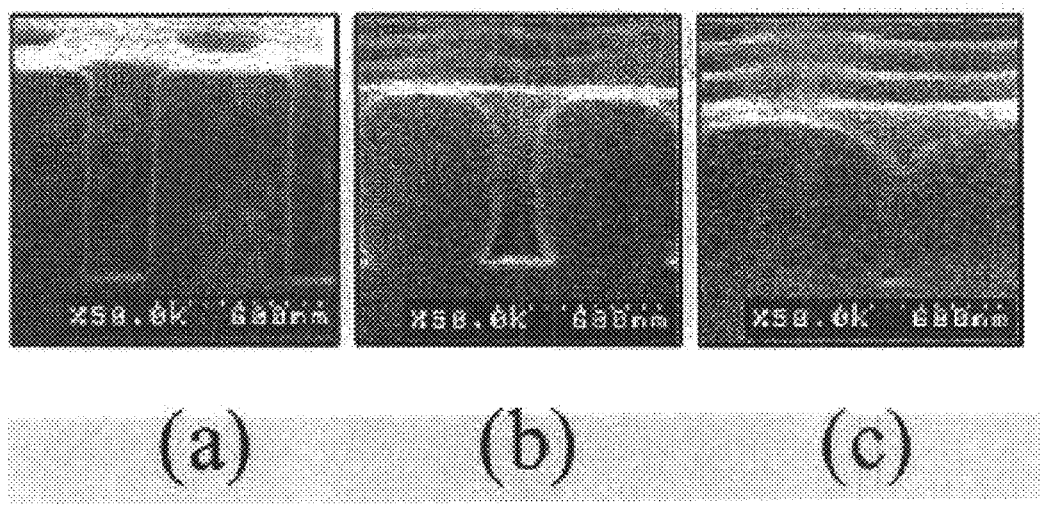
FIG. 3a is a 200 nm photoresist pattern obtained using resist-A comprising polymer A and patterns obtained after a resist flow process and FIGS. 3b–3c are 200 nm photoresist patterns of FIG. 3(a) after an additional flow bake step.

The photoresist composition, Resist-A, obtained in Comparative Example 1 was coated on a wafer, baked at 100° C. for 90 seconds and exposed to light using a 0.06 NA KrF exposing device (Nikon S201). The photoresist composition was post-baked at 110° C. for 90 seconds and developed in 2.38 wt % aqueous TMAH solution to obtain a 200 nm L/S pattern (see FIG. 3(a)). The resulting pattern was flow baked at 162° C. for 90 seconds to obtain patterns shown in FIGS. 3(b) and 3(c). Here, it was found that a section of the pattern after flow process was in a poor condition.

INVENTION EXAMPLE 2

Experiment of Flow Properties of Resist-C

The photoresist composition, Resist-C, obtained in Invention Example 1 was coated on a wafer, baked at 100° C. for 90 seconds and exposed to light using a 0.06 NA KrF exposing device (Nikon S201). The photoresist composition was post-baked at 110° C. for 90 seconds and developed in 2.38 wt % aqueous TMAH solution to obtain a 200 nm L/S pattern (see FIG. 4(a)). The resulting pattern was flow baked at 162° C. for 90 seconds to obtain patterns shown in FIGS. 4(b), 4(c) and 4(d). Unlike the Resist-A, an excellent section, especially in a vertical direction, was obtained and it was possible to obtain a pattern as fine as 25 nm.

EXPERIMENTAL EXAMPLE 2

Flow Property Improving Effect by Curing Mechanism

Figure 5:
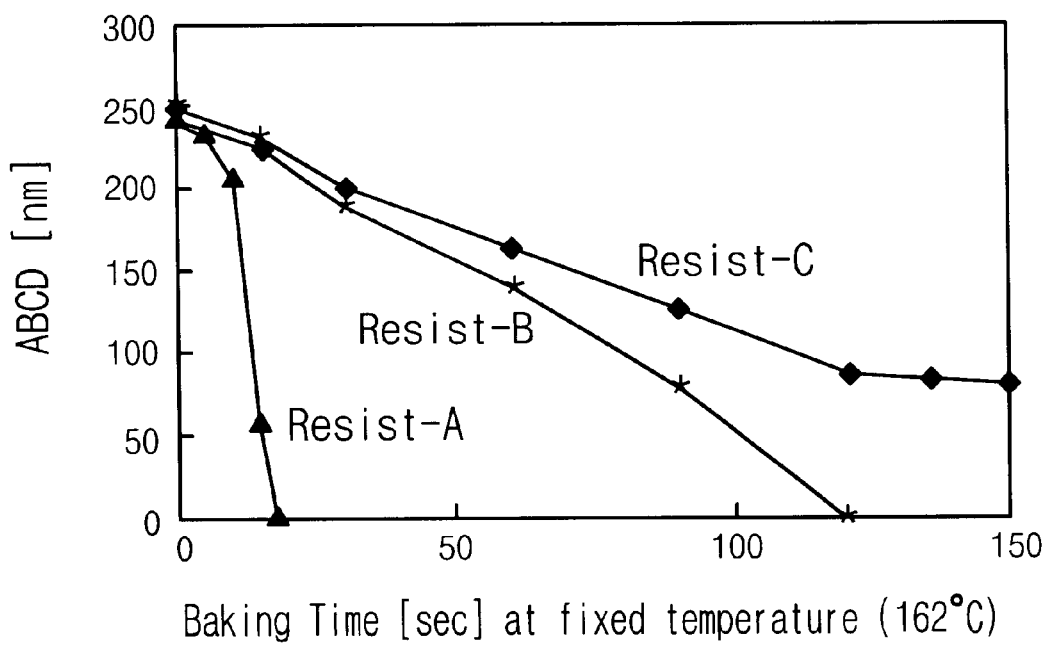
FIG. 5 graphically illustrates After Baking Critical Dimension (ABCD) versus the baking time using Resists-A, B and C as described below.

The prepared Resists-A, B and C were coated on a wafer respectively, baked at 110° C. for 90 seconds and exposed to light using a 0.06 NA KrF exposing device (Nikon S201). The photoresist composition was post-baked at 110° C. for 90 seconds and developed in 2.38 wt % aqueous TMAH solution to obtain a 200 nm L/S pattern. The resulting pattern was flow baked at 162° C. for 0, 10, 20, 30, 60, 90 and 120 seconds. The CD result of the pattern is shown in FIG. 5. Theoretically, the Experimental Example 1 tells that when a resist flow process is performed, the pattern size of resist-A should be reduced first, resist-C is next, and resist-B to the last. The actual experiment result shows, however, resist-C is the slowest in declining size of the pattern. This means that during the baking procedure at 162° C., cross-linking between phenol (from polymer A containing Resist-A as a resin) and carboxylic acid (from polymer B containing Resist-B as a resin), thus interfering flow. Therefore, the inventors discovered that resist-C from the present Invention Example 1 has the best flow properties.

INVENTION EXAMPLE 3

Formation of a Contact Hole Using Resist-C

Figure 4:
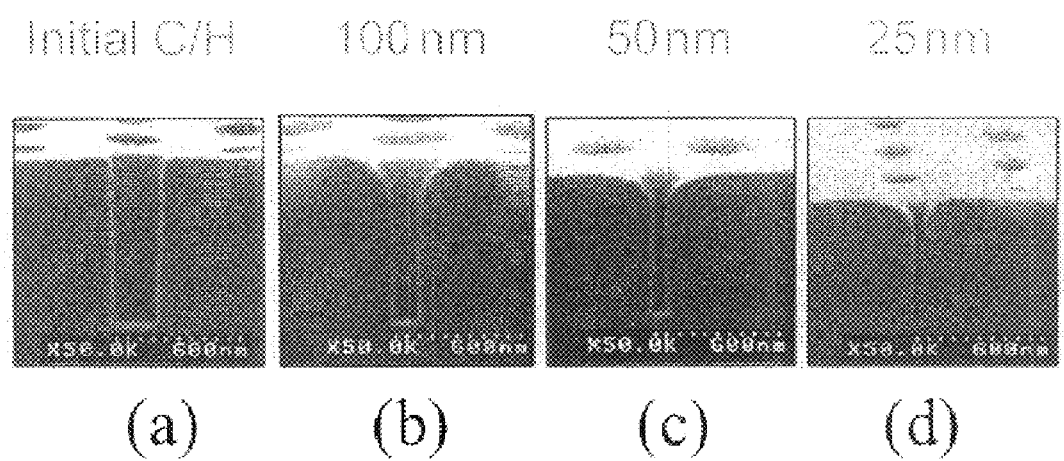
FIG. 4a is a 200 nm photoresist pattern obtained using Resist-C comprising Polymer C and FIGS. 4b–4d are patterns obtained after a resist flow process.

Using 50 nm pattern obtained from the above Invention Example 2 (see FIG. 4(c)) as an etching mask, lower oxide layer was etched to form a contact hole as shown in FIG. 6.

Photoresist compositions containing phenol group and carboxylic acid group of the present invention prevents a contact hole from being collapsed, which is usually caused by overflow during a resist flow process, so that a smaller sized contact hole than the resolution of the exposing device can be formed.

The foregoing discussion of the invention has been presented for purposes of illustration and description. The foregoing is not intended to limit the invention to the refinements disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist composition comprising:
   a photoresist resin,
   a photoacid generator, and
   an organic solvent,
   wherein the photoresist resin comprises
      a first copolymer comprising a compound of the formula

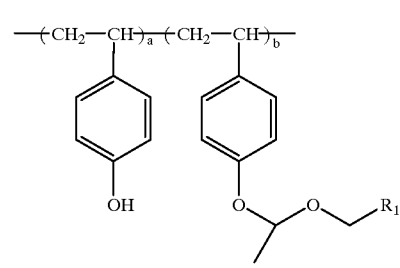

1 wherein
      $R_1$ is H, a ($C_1$–$C_{10}$) alkyl or a ($C_1$–$C_{10}$) aryl, and
      a mol % ratio of a:b ranges from about 20:80 to about 80:20, and
   a second copolymer comprising a compound of the formula

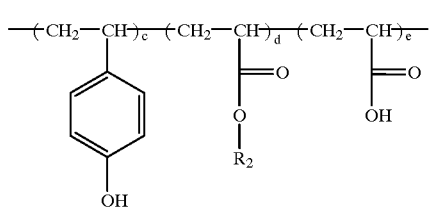

2 wherein
      $R_2$ is an acid labile protecting group; and
      a mol % ratio of c:d:e is such that c ranges from about 30 mol % to about 70 mol %, d ranges from about 28 mol % to about 50 mol % and e ranges from about 2 mol % to about 15 mol %.

2. The photoresist composition of claim 1 wherein the photoresist composition is used for a photoresist flow process.

3. The photoresist composition of claim 1 wherein the acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-tert-butoxyethyl, 1-isobutoxyethyl and 2-acetylmenth-1-yl.

4. The photoresist composition of claim 1 wherein $R_1$ is $CH_3$, and $R_2$ is butyl.

5. The photoresist composition of claim 1 wherein a weight % ratio of the first copolymer to the second copolymer ranges from about 20:80 to about 80:20.

6. The photoresist composition of claim 1 wherein the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

7. The photoresist composition of claim 1 wherein the photoacid generator is present in an amount ranging from about 0.05% to about to 0.3% by weight of the photoresist resin.

8. The photoresist composition of claim 1 wherein the said organic solvent is selected from the group consisting of propylene glycol methyl ether acetate, ethyl lactate, methyl 3-methoxypropionate, ethyl 3-ethoxypropionate and cyclohexanone and mixtures thereof.

9. The photoresist composition of claim 1 wherein the organic solvent is present in an amount ranging from about 400% to about 800% by weight of the photoresist resin.

10. A process for forming a photoresist pattern comprising the steps of:
(a) coating the photoresist composition of claim 1 on a substrate of a semiconductor element to form a photoresist film;
(b) forming a first photoresist pattern using a lithography process; and
(c) producing a second photoresist pattern from the first photoresist pattern using a resist flow process.

11. The process of claim 10 wherein the resist flow process comprises heating the first photoresist pattern to temperature ranging from about 140° C. to about 170° C.

12. The process of claim 10 wherein the first and second photoresist patterns comprise a contact hole pattern.

13. A semiconductor element manufactured by the process of claim 10.

14. A photoresist composition comprising:
a photoresist resin,
a photoacid generator, and
an organic solvent,
wherein the photoresist resin comprises:
a first copolymer comprising a compound of the formula

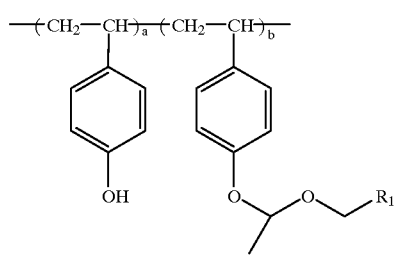

wherein
$R_1$ is H, a $(C_1-C_{10})$ alkyl or a $(C_1-C_{10})$ aryl, and
a second copolymer comprising a compound of the formula

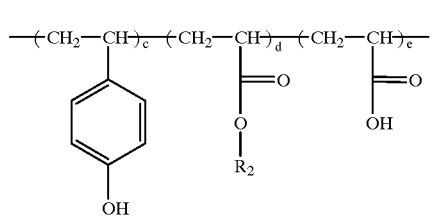

wherein
$R_2$ is an acid labile protecting group and a–e are greater than 0.

15. The photoresist composition of claim 14 wherein a mol % ratio of a:b ranges from about 20:80 to about 80:20.

16. The photoresist composition of claim 14 wherein c is present in an amount ranging from about 30 mol % to about 70 mol %, d is present in an amount ranging from about 28 mol % to about 50 mol % and d is present in an amount ranging from about 2 mol % to about 15 mol %.

17. The photoresist composition of claim 14 wherein the acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-tert-butoxyethyl, 1-isobutoxyethyl and 2-acetylmenth-1-yl.

18. The photoresist composition of claim 14 wherein $R_1$ is $CH_3$, and wherein $R_2$ is t-butyl.

19. The photoresist composition of claim 14 wherein a ratio of the first copolymer to the second copolymer ranges from about 20:80 to about 80:20.

20. The photoresist composition of claim 14, wherein the photoacid generators are selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

21. The photoresist composition of claim 14 wherein an amount of said photoacid generator ranges from about 0.05% to about 0.3% by weight of the photoresist resin.

22. The photoresist composition of claim 14 wherein the organic solvent is selected from the group consisting of propylene glycol methyl ether acetate, ethyl lactate, methyl 3-methoxypropionate, ethyl 3-ethoxypropionate and cyclohexanone and mixtures thereof.

23. The photoresist composition of claim 14 wherein an amount of the organic solvent ranges from about 400% to about 800% by weight of the photoresist resin.

24. A process for forming a photoresist pattern comprising the steps of:
(a) coating a photoresist composition on a substrate of semiconductor element to form a photoresist film, the photoresist compositions comprising
a photoresist resin, a photoacid generator, and
an organic solvent,
wherein the photoresist resin comprises
a first copolymer comprising a compound of the formula

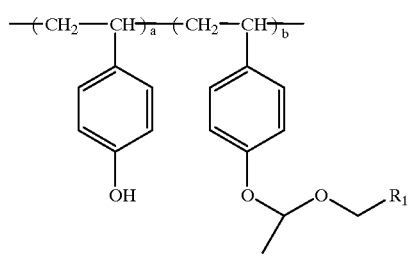

1 wherein
$R_1$ is H, a ($C_1$–$C_{10}$) alkyl or a ($C_1$–$C_{10}$) aryl, and
a second copolymer comprising a compound of the formula

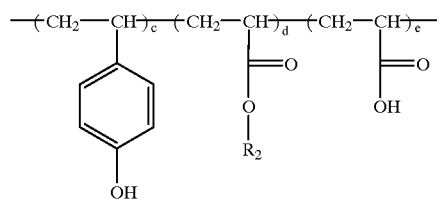

2 wherein
$R_2$ is an acid labile protecting group and a–e are greater than 0
(b) forming a first photoresist pattern using a lithography process; and
(c) producing a second photoresist pattern from said first photoresist pattern using a resist flow process.

25. The process of claim 24 wherein the resist flow process comprises heating said first photoresist pattern to a temperature ranging from about 140° C. to about 170° C.

26. The process of claim 24 wherein the first and second photoresist pattern each comprise a contact hole pattern.

27. A semiconductor element manufactured by the process of claim 24.

* * * * *

UNITED STATES PATENT AND TRADEMARK OFFICE
CERTIFICATE OF CORRECTION

PATENT NO. : 6,627,379 B2
DATED : September 30, 2003
INVENTOR(S) : Jin S. Kim et al.

It is certified that error appears in the above-identified patent and that said Letters Patent is hereby corrected as shown below:

Column 10,
Line 28, please delete "and d is present" and replace with -- and e is present --.

Signed and Sealed this

Twenty-third Day of March, 2004

JON W. DUDAS
*Acting Director of the United States Patent and Trademark Office*